(12) United States Patent
Leigh et al.

(10) Patent No.: US 10,849,253 B2
(45) Date of Patent: Nov. 24, 2020

(54) INTERCONNECTED MODULAR SERVER AND COOLING MEANS

(71) Applicant: HEWLETT PACKARD ENTERPRISE DEVELOPMENT LP, Houston, TX (US)

(72) Inventors: Kevin B. Leigh, Houston, TX (US); John R. Grady, Houston, TX (US); George Megason, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/718,392

(22) Filed: Sep. 28, 2017

(65) Prior Publication Data

US 2019/0098788 A1 Mar. 28, 2019

(51) Int. Cl.
  *H05K 7/14* (2006.01)
  *G06F 1/16* (2006.01)
  (Continued)

(52) U.S. Cl.
  CPC ............ *H05K 7/20736* (2013.01); *G06F 1/20* (2013.01); *G06F 13/409* (2013.01); *H05K 7/1445* (2013.01); *H05K 7/1487* (2013.01); *H05K 7/1488* (2013.01); *H05K 7/1492* (2013.01); *H05K 7/20136* (2013.01); *H05K 7/20145* (2013.01)

(58) Field of Classification Search
  CPC ............. G06F 1/16; G06F 1/20; G06F 13/409
  See application file for complete search history.

(56) References Cited

U.S. PATENT DOCUMENTS 5,854,904 A * 12/1998 Brown .................. G06F 1/1632
  710/100
6,256,197 B1 * 7/2001 Galis ......................... G06F 1/20
  165/126

(Continued)

FOREIGN PATENT DOCUMENTS

CN 2514623 Y 10/2002
CN 1766790 A 5/2006

(Continued)

OTHER PUBLICATIONS

'PCB Design Tutorial' by David L. Jones, Jun. 29, 2004. (Year: 2004).*

(Continued)

*Primary Examiner* — Steven G Snyder
(74) *Attorney, Agent, or Firm* — Nolte Intellectual Property Law Group

(57) ABSTRACT

An example frame shuffle is communicatively coupled to a midplane of a frame. The frame shuffle includes a first group of optical connectors. Each of which are communicatively coupled to a resource device via the midplane. The frame shuffle also includes a second group of optical connectors, each of which communicatively couples with a frame shuffle of an adjacent frame. The frame shuffle also includes a routing device to optically interconnect the resource devices and another group of resource devices of the adjacent frame. The frame shuffle also includes a frame shuffle fan to provide fresh air through the frame shuffle and direct exhaust air through the midplane.

13 Claims, 13 Drawing Sheets

(51) Int. Cl.
*G06F 13/40* (2006.01)
*G11B 33/12* (2006.01)
*H05K 7/20* (2006.01)
*G06F 1/20* (2006.01)

(56) References Cited

U.S. PATENT DOCUMENTS

| | | | | |
|---|---|---|---|---|
| 6,459,571 | B1* | 10/2002 | Carteau | G06F 1/184 312/35 |
| 6,533,587 | B1* | 3/2003 | Potter | G06F 1/184 257/E23.099 |
| 6,950,895 | B2* | 9/2005 | Bottom | G06F 1/183 361/796 |
| 7,535,707 | B2* | 5/2009 | Seibold | G06F 1/188 361/679.49 |
| 8,045,328 | B1* | 10/2011 | Chen | H05K 7/20727 165/121 |
| 8,064,200 | B1* | 11/2011 | West | H05K 7/20563 361/694 |
| 8,279,601 | B2* | 10/2012 | Lima | G06F 1/20 361/694 |
| 8,284,771 | B1 | 10/2012 | Julien et al. | |
| 8,582,290 | B2* | 11/2013 | Coglitore | G06F 1/18 361/679.46 |
| 8,743,549 | B2* | 6/2014 | Frink | G06F 1/187 361/724 |
| 8,755,191 | B2* | 6/2014 | Riebel | H05K 7/1488 361/679.38 |
| 8,842,432 | B2* | 9/2014 | Ehlen | H05K 1/14 361/679.49 |
| 9,192,077 | B2* | 11/2015 | Iqbal | H05K 7/20745 |
| 9,241,427 | B1* | 1/2016 | Stevens | G11B 33/142 |
| 9,537,291 | B1* | 1/2017 | Wilding | H05K 7/20836 |
| 9,582,450 | B2* | 2/2017 | Luck | G06F 1/181 |
| 9,603,289 | B1 | 3/2017 | Shearman et al. | |
| 9,653,124 | B2* | 5/2017 | Heyd | G11B 33/128 |
| 9,690,065 | B2 | 6/2017 | Wiltjer et al. | |
| 9,706,678 | B1 | 7/2017 | Chen et al. | |
| 9,936,611 | B1* | 4/2018 | Beall | B21D 39/00 |
| 9,996,119 | B2* | 6/2018 | Leigh | G06F 1/18 |
| 10,001,819 | B2* | 6/2018 | Heyd | G11B 33/128 |
| 10,026,454 | B2* | 7/2018 | Davis | G11B 33/128 |
| 10,264,716 | B2* | 4/2019 | Hong | G09F 9/30 |
| 2006/0087813 | A1 | 4/2006 | Becker et al. | |
| 2006/0238991 | A1* | 10/2006 | Drako | G06F 1/185 361/796 |
| 2007/0025271 | A1* | 2/2007 | Niedrich | G06F 1/189 370/254 |
| 2007/0230148 | A1* | 10/2007 | Campini | G06F 13/409 361/788 |
| 2008/0310097 | A1* | 12/2008 | Sherrod | H05K 7/1488 361/679.4 |
| 2011/0194242 | A1* | 8/2011 | Hu | G06F 1/187 361/679.32 |
| 2012/0050986 | A1* | 3/2012 | Riebel | H05K 7/1488 361/679.48 |
| 2012/0120596 | A1 | 5/2012 | Bechtolsheim | |
| 2013/0077223 | A1* | 3/2013 | Xu | G06F 1/20 361/679.4 |
| 2013/0102237 | A1* | 4/2013 | Zhou | G06F 1/189 454/184 |
| 2013/0120935 | A1* | 5/2013 | Huang | G06F 1/20 361/695 |
| 2013/0267161 | A1* | 10/2013 | Iqbal | H05K 7/20736 454/184 |
| 2014/0002988 | A1 | 1/2014 | Roesner et al. | |
| 2014/0133086 | A1* | 5/2014 | Chen | H05K 7/20145 361/679.33 |
| 2014/0133087 | A1* | 5/2014 | Chen | G06F 1/20 361/679.33 |
| 2014/0254074 | A1 | 9/2014 | Kim et al. | |
| 2014/0268552 | A1* | 9/2014 | Provenzale | H05K 7/20727 361/679.51 |
| 2014/0369654 | A1* | 12/2014 | Magason | G02B 6/4261 385/92 |
| 2015/0289405 | A1* | 10/2015 | Stewart | H05K 7/183 211/26 |
| 2015/0347345 | A1* | 12/2015 | Hellriegel | G06F 13/409 710/301 |
| 2015/0382496 | A1* | 12/2015 | Burant, Jr. | H01M 2/10 361/624 |
| 2016/0073544 | A1* | 3/2016 | Heyd | G11B 33/128 361/679.31 |
| 2016/0124410 | A1 | 5/2016 | Obst et al. | |
| 2016/0124470 | A1* | 5/2016 | Leigh | G06F 1/18 361/679.58 |
| 2016/0183413 | A1 | 6/2016 | Roesner et al. | |
| 2017/0150621 | A1* | 5/2017 | Breakstone | G06F 13/4022 |
| 2017/0235347 | A1* | 8/2017 | Heyd | G11B 33/128 361/679.31 |
| 2017/0257970 | A1 | 9/2017 | Alleman et al. | |
| 2019/0098788 | A1 | 3/2019 | Leigh et al. | |

FOREIGN PATENT DOCUMENTS

| | | |
|---|---|---|
| CN | 101507379 A | 8/2009 |
| CN | 202548735 U | 11/2012 |
| CN | 102866744 A | 1/2013 |
| CN | 103562817 A | 2/2014 |
| CN | 104040396 A | 9/2014 |
| CN | 106068483 A | 11/2016 |

OTHER PUBLICATIONS

'Universal Server Rails & Vertical Rack Rails' from Server Rack Online (archived on Feb. 15, 2017) (Year: 2017).*

'Vertical & Side Wall Mount Enclosures' by rack mount solutions (archived on Jul. 2, 2017). (Year: 2017).*

Tevelec Limited; "Server Rack Mount Enclosure Systems," (Web Page), Retrieved online Sep. 11, 2017, https://www.tevelec.com/rack-mount-enclosure-systems.

* cited by examiner

INTERCONNECTED MODULAR SERVER AND COOLING MEANS

BACKGROUND

Certain computing systems are composed of modular units (called "modules" or "devices"). These devices contain components of a server, which are interconnected. In some example systems, each device contains a specific type of component (e.g. computational, storage, fabric), and multiple devices are interconnected to allow virtualized servers to be created using the resourced contained on the multiple devices. Certain types of computing systems may use interconnections between the devices to dynamically create the virtualized servers.

As the computing systems become more dynamic, the interconnections between the devices may carry more bandwidth between the devices. The devices may also use increasingly powerful circuitry and components to process the additional bandwidth, which may result in an additional thermal load to be handled by the computing system.

BRIEF DESCRIPTION OF THE DRAWINGS

For a more complete understanding of the present disclosure, examples in accordance with the various features described herein may be more readily understood with reference to the following detailed description taken in conjunction with the accompanying drawings, where like reference numerals designate like structural elements, and in which.

Figure 1:
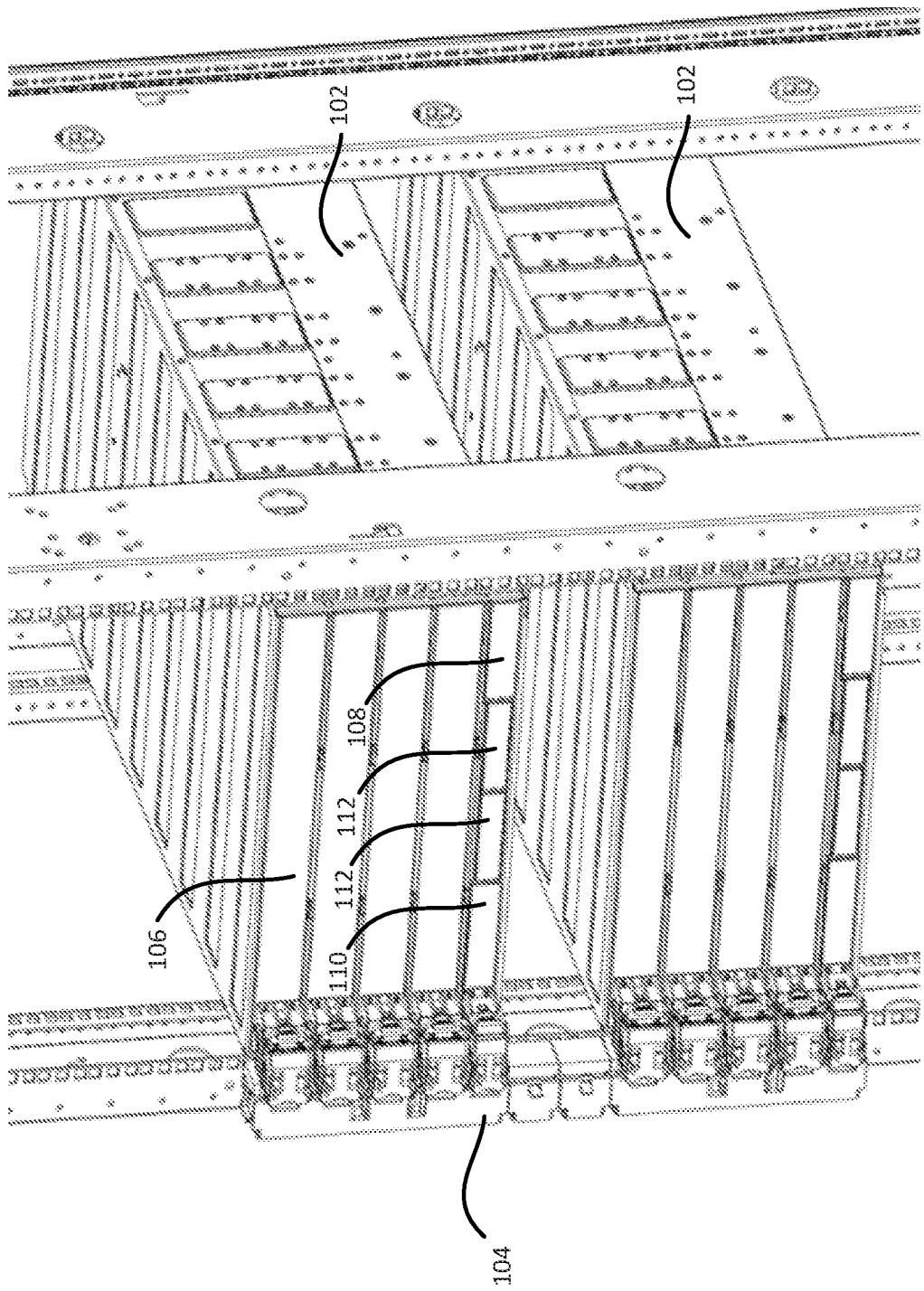
FIG. 1 illustrates an example computing system include multiple frames and a rocker arm plenum.

certain examples have features that are in addition to or in lieu of the features illustrated in the above-referenced figures. Certain labels may be omitted from certain figures for the sake of clarity.

DETAILED DESCRIPTION

Modular computing systems include at least one frame. A frame is an enclosed computing unit including devices (e.g. compute device, fabric device, storage device, power supply) and other components. In some examples, a modular computing system includes multiple frames interconnected with optical interfaces. A modular computing system may include a rocker arm plenum to provide rack-scale high speed optical connectivity between resource devices. In this disclosure, resource devices refer to modular units that can be partitioned by software for use by multiple virtualized servers (e.g. compute device, fabric device, storage device). A frame of the modular computing system may also include a frame shuffle to interconnect resource devices of the frame and also provide interconnectivity with adjacent frames. In some examples, the rocker arm plenum provides high bandwidth data interconnectivity and the frame shuffle provides management interconnectivity. In certain examples, frame shuffles of adjacent frames are optically connected using frame bridges.

In certain examples, frames contain a midplane which provides interconnectivity between devices of the frame. The midplane receives resource devices and management devices, and interconnects them using traces printed on the midplane. In some examples, the midplane also receives fabric shuffles that interconnect the resource devices. Due to the compact nature of the frame and the large amount of power used by circuitry in the management devices, the resource devices, power supplies, and the frame shuffles, the frame generates heat. Each of the circuitries of the devices has an optimum operating temperature range, and the frame includes fans to provide fresh air to components of the frame and expel exhaust air out of the frame. The midplane is designed to interconnect the devices of the frame as well as properly permit airflow through apertures of the midplane to cool the devices of the frame.

Certain devices retained in the frame may include channels to direct exhaust air from other devices through the frame without interfering with fresh airflow to other devices. For example, a power routing device may provide main power to a power supply through a power line and also channel exhaust air from the power supply around the resource devices and out the back of the frame. As another example, a frame management device may communicatively couple a management connector to the midplane and also provide a channel for exhaust air from a power supply to direct the exhaust air around the resource devices and out the back of the frame. The power supplies may supply the exhaust air to the channels of the devices through baffles that pass through the midplane. In some examples, the power supplies pass through the midplane and couple with baffles retained in the rear portion of the frame.

Since the frame shuffles interconnect the resource devices, interconnection traces on the midplane may reside on a small portion of the surface of the midplane. Large apertures in the midplane allow airflow to pass through the midplane, and also allow baffles to pass through the midplane. In some examples, the baffles reside in the rear portion of the frame. The frame shuffles include optical connectors coupled to a routing device. The routing device may generate heat as a byproduct of operation. Frame shuffle also includes a frame shuffle fan to provide fresh air through the frame shuffle and to direct exhaust air through the midplane. In some examples, the midplane includes a baffle to direct exhaust air from the frame shuffle into a channel within a resource module to exhaust out the back of the frame while passing around circuitry of the resource module.

In FIG. 1, an example modular computing system is illustrated. Modular computing system 100 includes a rack that retains frames 102. Each frame 102 includes an enclosure that retains devices and components of frame 102. In this disclosure, the term "device" refers to a computing system unit or module (e.g. computing module, storage module, fabric module, power supply unit, resource management module, frame management module). Frames 102 are interconnected by rocker-arm plenum 104, which couples to devices of each frame 102 and optically interconnects frames 102. In some examples, rocker-arm plenum 104 establishes high-bandwidth optical data interconnectivity between frames 102 within modular computing system 100 and lower-bandwidth optical management interconnectivity is established between devices of each frame 102 and between devices of adjacent frames 102 through frame shuffles retained within each frame 102. A frame shuffle may be optically communicatively coupled with a frame shuffle of an adjacent frame 102 through a frame bridge (to be described later).

Frame 102 retains resource devices 106 inside the enclosure. Resource devices 106 include optical connectors that couple with complementary optical connector passthroughs on a midplane in frame 102. In some examples, the optical connector passthroughs allow optical connectors of resource devices 106 to couple with complementary optical connectors of other components of frame 102 (e.g. frame shuffles, other resource devices, etc.) In some examples, the enclosure includes rails or other means of guiding resource device 106 so that upon insertion resource device 106 is retained in a way that couples the optical connectors of resource device 106 with the complementary optical connector passthroughs of the midplane. In some examples, resource devices 106 are retained in a rear portion of frame 102. For purposes of this disclosure, a "front portion" of a frame is forward of the midplane and a "rear portion" of the frame is rearward of the midplane. Multiple resource devices 106 may be retained in a vertical stack within frame 102.

Resource devices 106 are interconnected as described in a network topology. For example, computing resource devices are connected to storage resource devices through fabric resource devices and computing resource devices are connected to other computing resource devices through fabric resource devices. There are many types of interconnections used in various large-scale computing environments.

Modular computing system 100 includes frames 102 that allow flexibility in how resource devices 106 are laid out, allowing any type of resource device 106 to be received at any resource device slot of frame 102. For example, a first frame 102 could include all storage resource devices, a second frame 102 could include all compute resource devices, and a third frame 102 could include all fabric resource devices. In another example, a first frame 102 could include storage resource devices and compute resource devices, a second frame 102 could include fabric resource devices, and a third frame 102 could include fabric resource devices and storage resource devices. This flexibility also allows the modular computing system to be reconfigured easily. A resource device 106 of a frame 102 may be removed and replaced with a different type of resource device 106. Resources of resource devices 106 are allocated to tasks by a resource management device 112 (e.g. a composer). In some examples, each frame 102 is has its resources allocated separately from other frames 102. For example, storage, compute, and fabric resources are allocated to a first task from a first frame 102. In other examples, all of the frames 102 of modular computing system 100 are viewed by the resource management device 112 as a single logical frame. For example, storage, compute, and fabric resources are allocated to a first task from any frame 102, as determined by the resource management device 112.

In order to allow interconnection of these dynamically replaceable resource devices 106, and in order to reduce the amount of confusing cabling, modular computing system 100 interconnects resource devices 106 via frame shuffles and a rocker-arm plenum 104. Frame shuffles interconnect resource devices 106 within a frame 102, and rocker-arm plenum 104 provides a high-bandwidth interconnection among the frames 102 in modular computing system 100. In some examples, frame shuffles and rocker-arm plenum 104 are optical interconnectors for use with photonics-capable resource devices 106. In other examples, frame shuffles and rocker-arm plenum 104 are electrical interconnectors comprising copper cables. This disclosure anticipates any form of interconnection between resource devices 106.

Frames 102 also include a power routing device 108 and a frame management device 110. Power routing device 108 receives main power from a power cable at the back of modular computing device 100 and transfers main power from the back of modular computing device 100 through the midplane to a power supply in the front portion of frame 102 using a power line. In certain examples, the power line couples to the power supply at a point on the power supply that extends into the rear portion of frame 102. In some examples, power routing device 108 contains a channel and vents to direct exhaust air from the power supply out the rear of modular computing device 100 without the exhaust air flowing through resource devices 106. Frame management device 110 includes a management connector to connect an administrator device to frame 102. The administrator device is a computing device controlled by a network administrator to communicate with components of frame 102 via a network connection. In some examples, the administrator device is coupled to the management connector through an Ethernet connection. In some examples, frame management device 110 connects the administrator device to the midplane via a management line and also transfers main power from the back of modular computing device 100 through the midplane to a power supply in the front portion of frame 102 using a power line. In certain examples, the power line couples to the power supply at a point on the power supply that extends into the rear portion of frame 102. Frame management device 110 may also include a channel and vents to direct exhaust air from the power supply out the rear of modular computing device 100 without the exhaust air flowing through resource devices 106.

Frames 102 also include resource management devices 112. Resource management devices 112 coordinate resources requested by workload tasks. In some examples, modular computing system 100 executes virtual servers that request resources. In some other examples, modular computing system 100 executes workload tasks "bare metal" without a virtual layer between the resources and the task. Resource management devices 112 may communicatively couple to the midplane and receive fresh air from fans in the front portion of frame 102 through apertures in the midplane. In certain examples, frame 102 may contain a baffle to direct fresh air through the midplane and to resource management devices 112.

Figure 2:
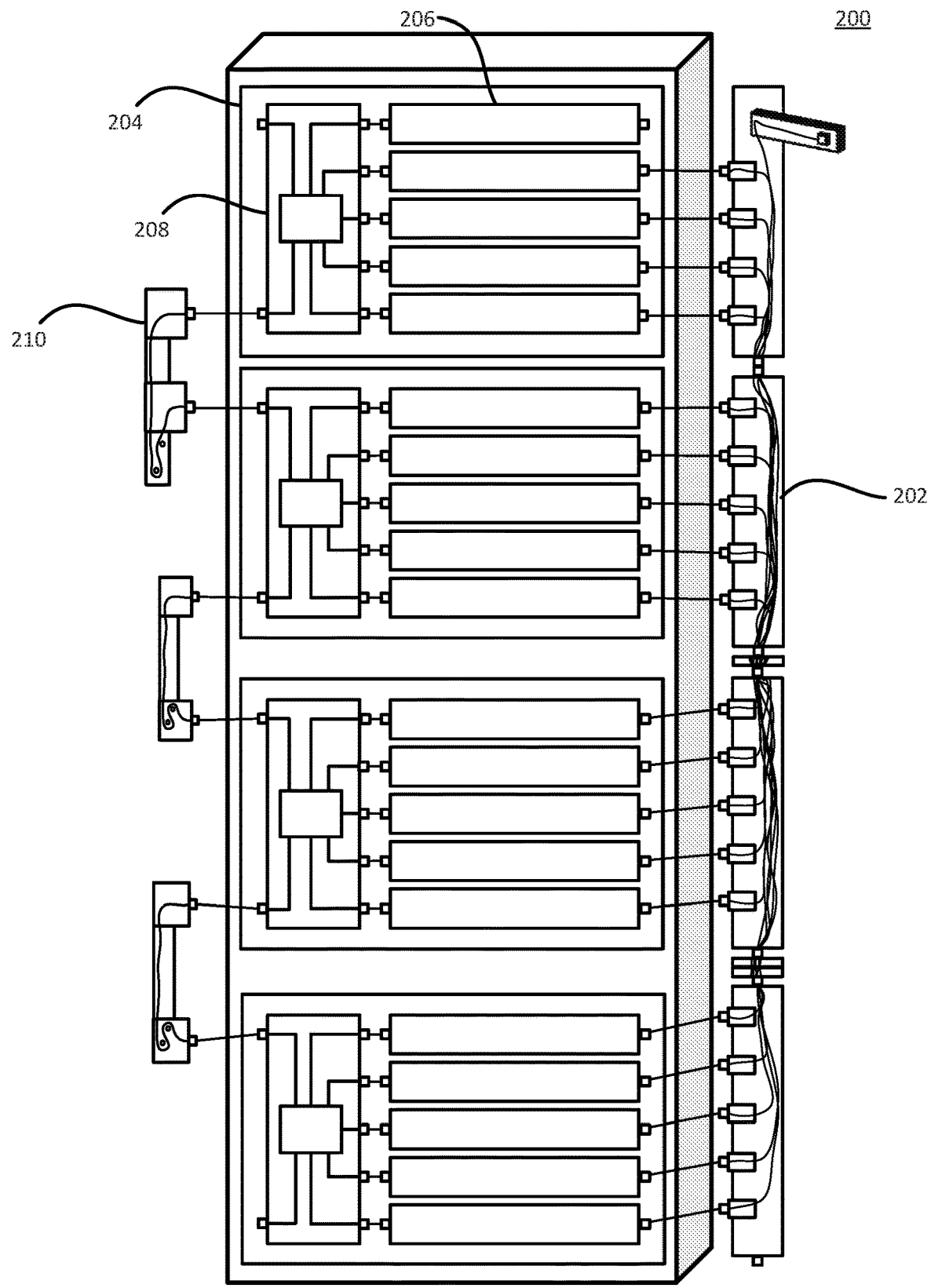
FIG. 2 illustrates an example computing system including multiple interconnected frames.

FIG. 2 illustrates an example modular computing system including a frame shuffle and resource devices. Modular computing system 200 includes frames 204 interconnected by a rocker-arm plenum 202. Each frame 204 receives multiple resource devices 206 and a frame shuffle 208 that interconnects the resource devices 206 of frame 204. Frame shuffle 208 is interconnected to a frame shuffle 208 of an adjacent frame 204 by a frame bridge 210.

In some examples, resource devices 206 are capable of photonic (or "optical") communication, and include optical connectors. Resource devices 206 communicatively couple to frame shuffle 208 via certain of the optical connectors. Certain other of the optical connectors communicatively coupled resource devices 206 to rocker-arm plenum 202. Rocker-arm plenum 202 contains optical lines interconnecting resource devices 206 from multiple frames 204 received in modular computing system 200. The optical interconnections between resource devices 206 provided by rocker-arm plenum 202 are high-bandwidth interconnections capable of high-speed data transmission. For example, a compute resource device 206 on a first frame 204 may communicate a write operation to a storage resource device 206 on a second frame 204 through rocker-arm plenum 202.

Frame shuffles 208 may also be capable of photonic communication, and may also include optical connectors. Frame shuffles 208 are communicatively coupled to resource devices 206 of a frame 204 through certain of the optical connectors. Signals send to or received on these certain optical connectors are transmitted through optical lines to a routing device. The routing device optically interconnects the resource devices 206 of frame 204 and also interconnects the resource devices 206 of frame 204 with resource devices 206 of another frame 204 through frame bridge 210. Frame shuffle 208 communicatively couples to frame bridge 210 through certain other optical connectors. Frame shuffle 208 may be a lower-bandwidth optical interconnection used for management command transmission. In some examples, frame shuffle 208 and resource management devices implement an out-of-band management system. In certain examples, the routing device is an electrical device coupled to optical-electrical interfaces. In some other examples, the routing devices is a device capable of routing optical signals.

Figure 3:
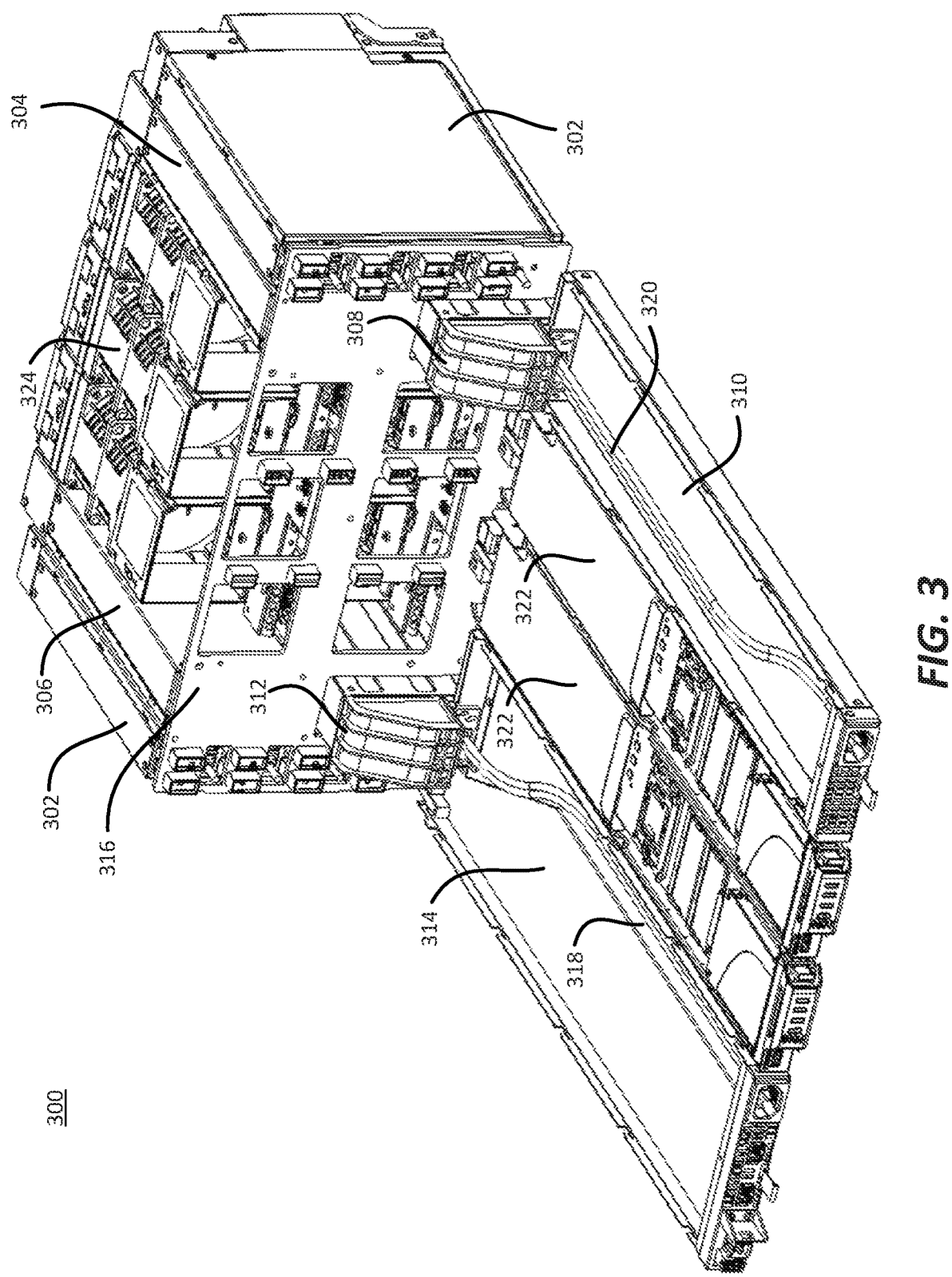
FIG. 3 illustrates an example frame.

FIG. 3 illustrates an example frame with its enclosure removed. Frame 300 includes frame shuffles 302 and power supplies 304 and 306 in the front portion of frame 300. Frame shuffles 302 are communicatively coupled to midplane 316 by optical connectors of frame shuffles 302 coupling with complementary optical connector passthroughs of midplane 316. Frame shuffles 302 also include vents that align with apertures on midplane 316. Power supply 304 includes an airflow baffle 308 to redirect exhaust air from power supply 304. Airflow baffle 308 passes through an aperture of midplane 316 and directs exhaust air away from resource devices (not shown) in the back portion of frame 300. In some examples, a portion of power supply 304 passes through the aperture of midplane 316 and coupled to airflow baffle 308, which resides in the rear portion of frame 300. Similarly, power supply 306 includes an airflow baffle 312 to redirect exhaust air from power supply 306. Airflow baffle 312 passes through an aperture of midplane 316 and directs exhaust air away from resource devices (not shown) in the back portion of frame 300. In some examples, a portion of power supply 306 passes through the aperture of midplane 316 and coupled to airflow baffle 312, which resides in the rear portion of frame 300.

Power routing device 310 (shown without a cover) transfers main power received at a power adapter at the rear of frame 300 to power supply 304 through power line 320, which is electrically coupled to midplane 316. In some examples, power line 320 passes through an aperture in midplane 316 and directly couples to power supply 304. In some other examples, power line 320 couples to power supply 304 at a point where power supply 304 is in the rear portion of frame 300. Power routing device 310 also contains a vent at the rear of frame 300 that, in combination with an enclosure (including the cover) of power routing device 310, creates an airflow channel for exhaust air from power supply 304 to be directed out of frame 300 without passing through resource devices in the back portion of frame 300. Airflow baffle 308 interfaces with the cover of power routing device 310 so that air directed through airflow baffle 308 is received in the airflow channel and directed through power routing device 310 and outside the frame 300.

Similarly, frame management device 314 (shown without a cover) transfers main power received at a power adapter at the rear of frame 300 to power supply 306 through power line 318, which electrically couples to midplane 316. In some examples power line 318 passes through an aperture of midplane 316 and directly couples to power supply 306. In some other examples, power line 318 couples to power supply 306 at a point where power supply 306 is in the rear portion of frame 300. Frame management device 314 also includes management connectors that are communicatively coupled with midplane 316 to allow an administrator device to manage frame 300. Frame management device 314 also contains a vent at the rear of frame 300 that, in combination with an enclosure (including the cover) of frame management device 314, creates an airflow channel for exhaust air from power supply 306 to be directed out of frame 300 without passing through resource devices in the back portion of frame 300. Airflow baffle 312 interfaces with the cover of frame management device 314 so that air directed through airflow baffle 312 is received in the airflow channel and directed through frame management device 314 and outside the frame 300.

Resource management devices 322 are communicatively coupled to midplane 316. Resource management devices 322 manage resources included in the resource devices and assign the resources to workflow tasks. In some examples, resource management devices 322 are communicatively coupled to the resource devices through midplane 316 and frame shuffles 302. In certain examples, resource management devices 322 receive airflow from resource device fans 324 through resource management baffles that pass through apertures in midplane 316. Resource device fans 324 also provide airflow to the resource devices through large apertures in midplane 316.

Power supplies 304 and 306, along with frame shuffles 302, generate large amounts of heat to be dissipated outside of frame 300. Due to the optical interconnectivity provided by frame shuffles 302 and a rocker-arm plenum, the electrical and photonic complexity of midplane 316 is reduced, allowing for fewer traces, connectors, and components to reside on midplane 316. Since there are fewer traces, connectors, and components, large and numerous apertures can be opened in midplane 316 to allow airflow to be directed where needed. Since devices of frame 300 reside in both the front portion and the rear portion, merely directing the hot exhaust air of the devices in the front portion into the devices of the rear portion can result in operating temperatures of the resource devices being outside their designed limits.

In order to avoid directing hot exhaust air into the resource devices, exhaust air from power supplies 304 and 306 is directed through airflow baffles 308 and 312, respectively. The exhaust air is then channeled through power routing device 310 and frame management device 314, away from the resource devices. Additionally, by routing power and management connections through the rear of frame 300, the front of frame 300 is kept clear of cluttering cables.

Likewise, hot exhaust air from frame shuffles 302 is directed into the rear portion of frame 300. In some examples, the exhaust air from frame shuffles 302 is sufficiently far away from temperature sensitive components of the resource devices, so no baffling or redirection of the exhaust air is necessary. The exhaust air can be allowed to flow through the side regions of the resource devices. In some other examples, the exhaust air from frame shuffles 302 is baffled through midplane 316 into airflow channels within the resource devices, passing the exhaust air around the temperature sensitive components of the resource devices.

Figure 4:
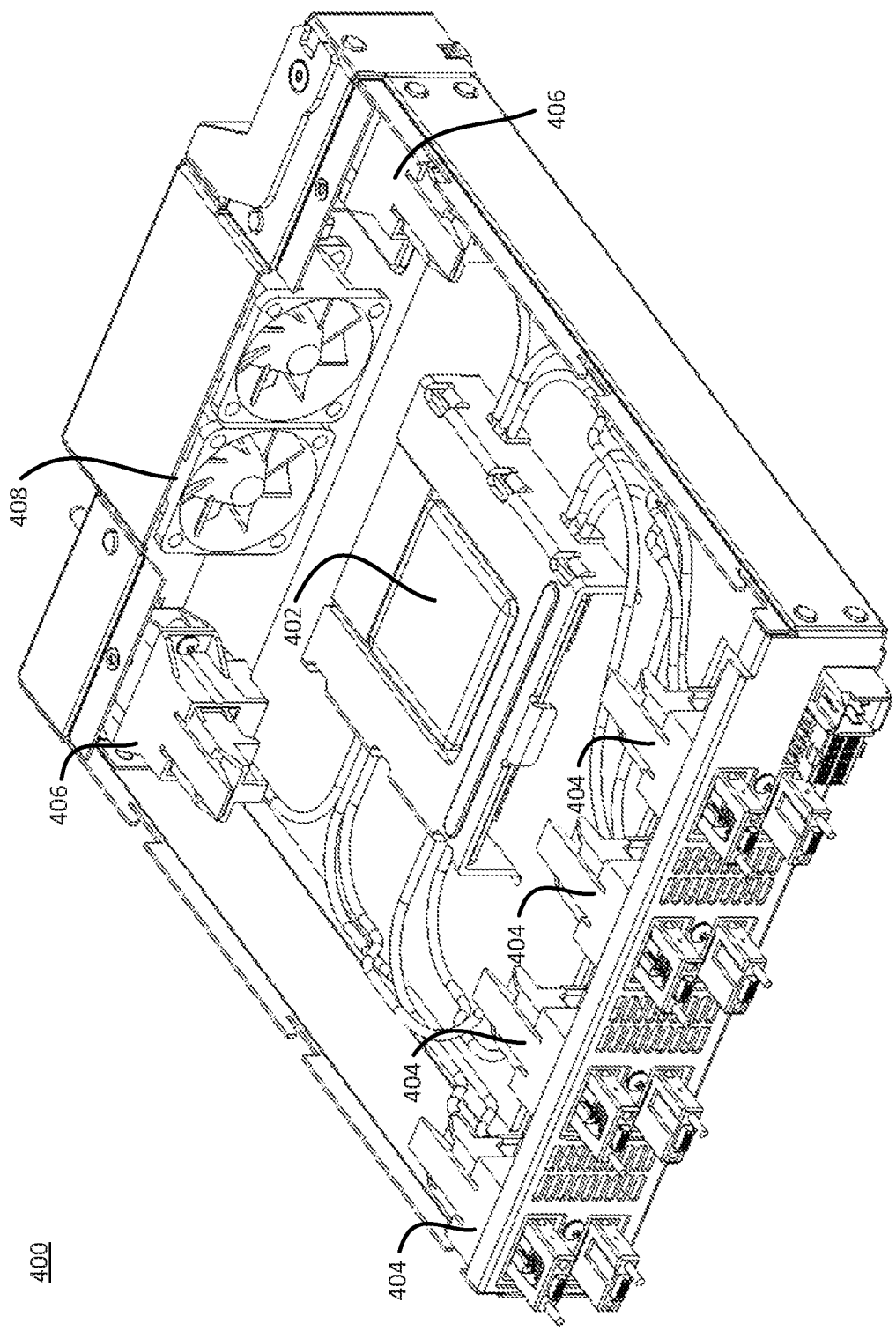
FIG. 4 illustrates an example frame shuffle.

FIG. 4 illustrates an example frame shuffle. Frame shuffle 400 includes a routing device 402, a first group of optical connectors 404, a second group of optical connectors 406, and frame shuffle fans 408. Frame shuffle 400 is received in a frame and communicatively couples to a midplane of the frame. The first group of optical connectors 404 couple with a complementary group of optical connector passthroughs on the midplane when frame shuffle 400 is received in the frame. In some examples, the optical connector passthroughs allow the first group of optical connectors 404 to couple with complementary optical connectors of other components of the frame (e.g. resource devices). Each of the first group of optical connectors 404 on frame shuffle 400 is communicatively coupled, via the midplane, to a resource device retained in the frame. In some examples, frame shuffle 400 is retained in the frame substantially vertically (i.e. the first group of optical connectors 404 are stacked vertically), and the resource devices are retained in the frame substantially horizontally (i.e. each successive resource devices is stacked vertically on top of the prior resource device) so that the optical connector passthroughs of the midplane that are coupled to frame shuffle 400 also couple to respective optical connectors of the resource devices directly on the opposite surface of the midplane.

The second group of optical connectors 406 couple to frame bridges. Frame bridges connect one frame shuffle 400 to an adjacent frame shuffle 400. The frame bridges optically interconnect adjacent frames, allowing management information to pass out-of-band between the frames.

Routing device 402 directs management network traffic from its origin to its destination. Routing device 402 is optically coupled to the first group of optical connectors 404 and the second group of optical connectors 406. In some examples, routing device 402 is an electrical device (e.g. a switching chip) coupled to optical-electric interfaces. Routing device 402 receives an optical signal from a first optical connector 404 or 406 coupled to a source device, converts the optical signal to an electrical signal at the optical-electrical interface coupled to the first optical connector 404 or 406, routes the electrical signal to a second optical connector 404 or 406 coupled to a destination device, and converts the electrical signal into an optical signal at the optical-electrical interface coupled to the second optical-electrical connector 404 or 406. In some other examples, routing device 402 is a device that routes optical signals without them requiring to be converted into electrical signals. Routing device 402 receives an optical signal from a first optical connector 404 or 406 coupled to a source device, and routes the optical signal to a second optical connector 404 or 406 coupled to a destination device. In certain examples, a resource management device is optically coupled to frame shuffle 400 and issues management commands to the management network. Routing device 402 receives the management commands from the resource management device and distributes the signal to destination resource devices.

Routing device 402 may be an integrated circuit, a system on a chip, or another component that may generate significant heat. Frame shuffle fans 408 provide fresh air through frame shuffle 400, and direct hot exhaust air from the frame shuffle through airflow vents interposed between the first group of optical connectors 404 and through the midplane. Frame shuffle fans 408 draw fresh air over routing device 402, cooling routing device 402. The midplane includes complementary apertures aligned with the vents of frame shuffle 400. In some examples, the midplane includes airflow baffles that direct exhaust air from frame shuffle 400 through the apertures aligned with the vents and into channels within the resource devices in the rear portion of the frame. The exhaust air is then directed out the back of the frame, bypassing temperature sensitive components of the resource devices.

Figure 5A:
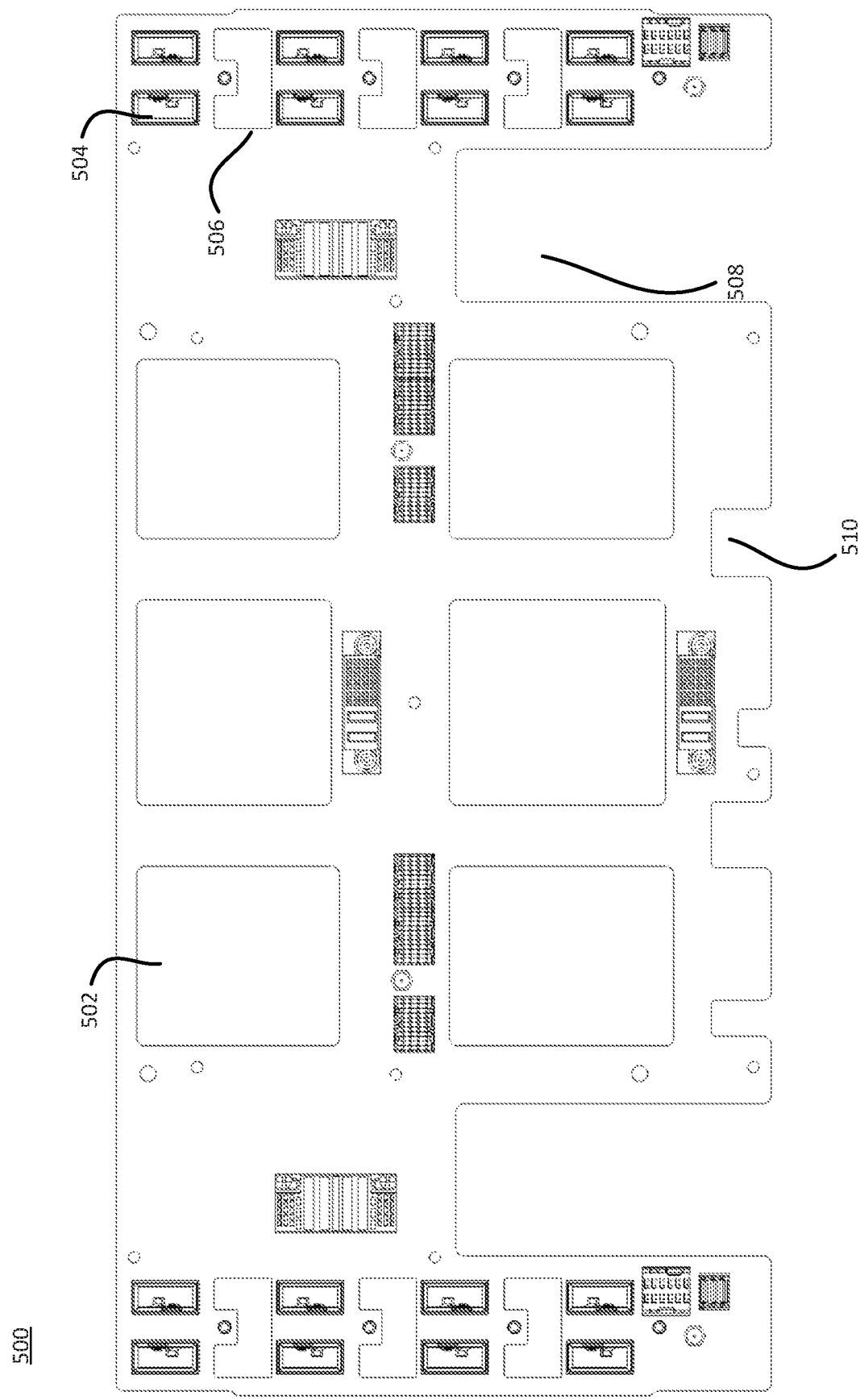
FIG. 5A illustrates an example midplane.
Figure 5B:
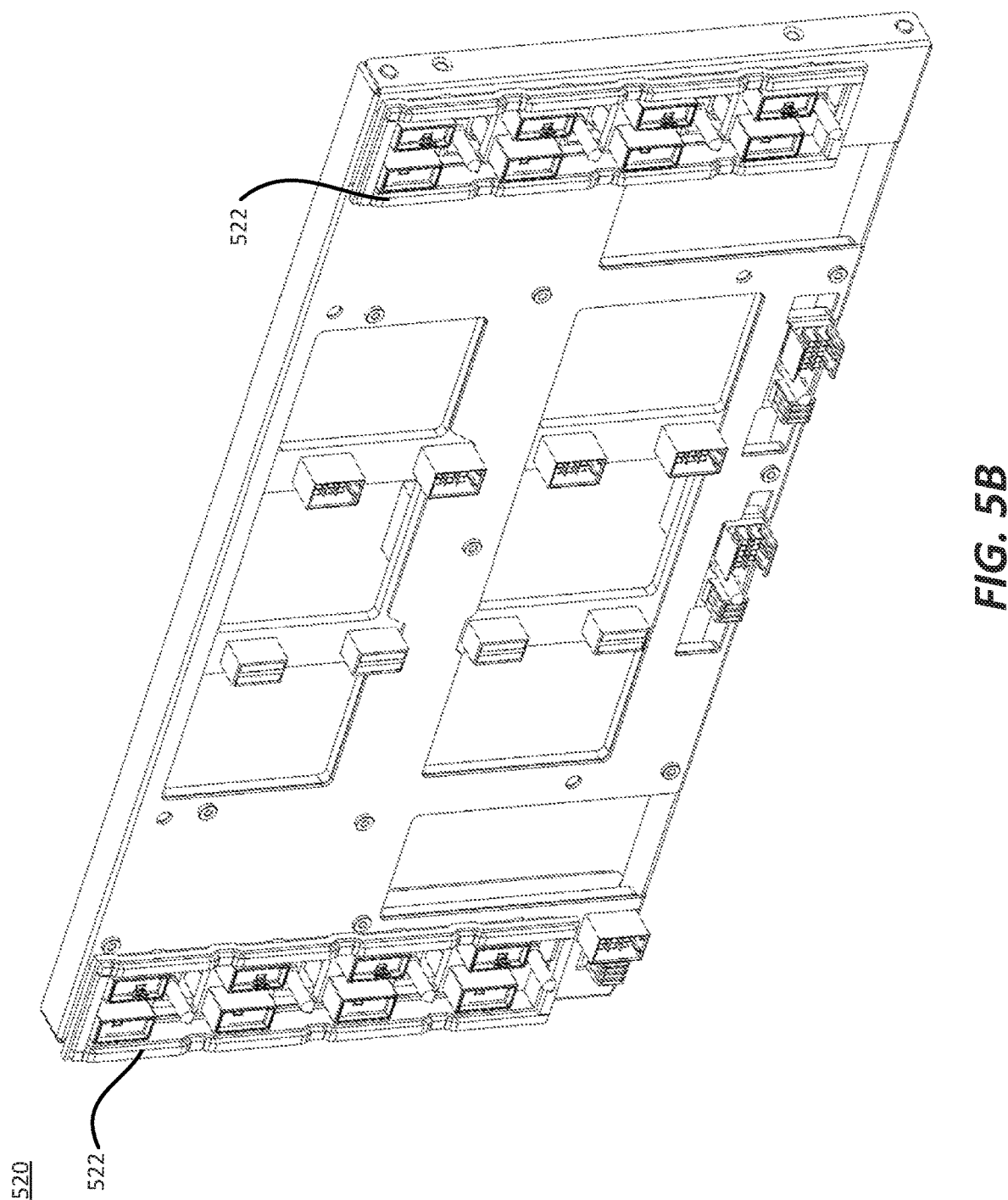
FIG. 5B illustrates another example midplane with a frame shuffle baffle.
Figure 5C:
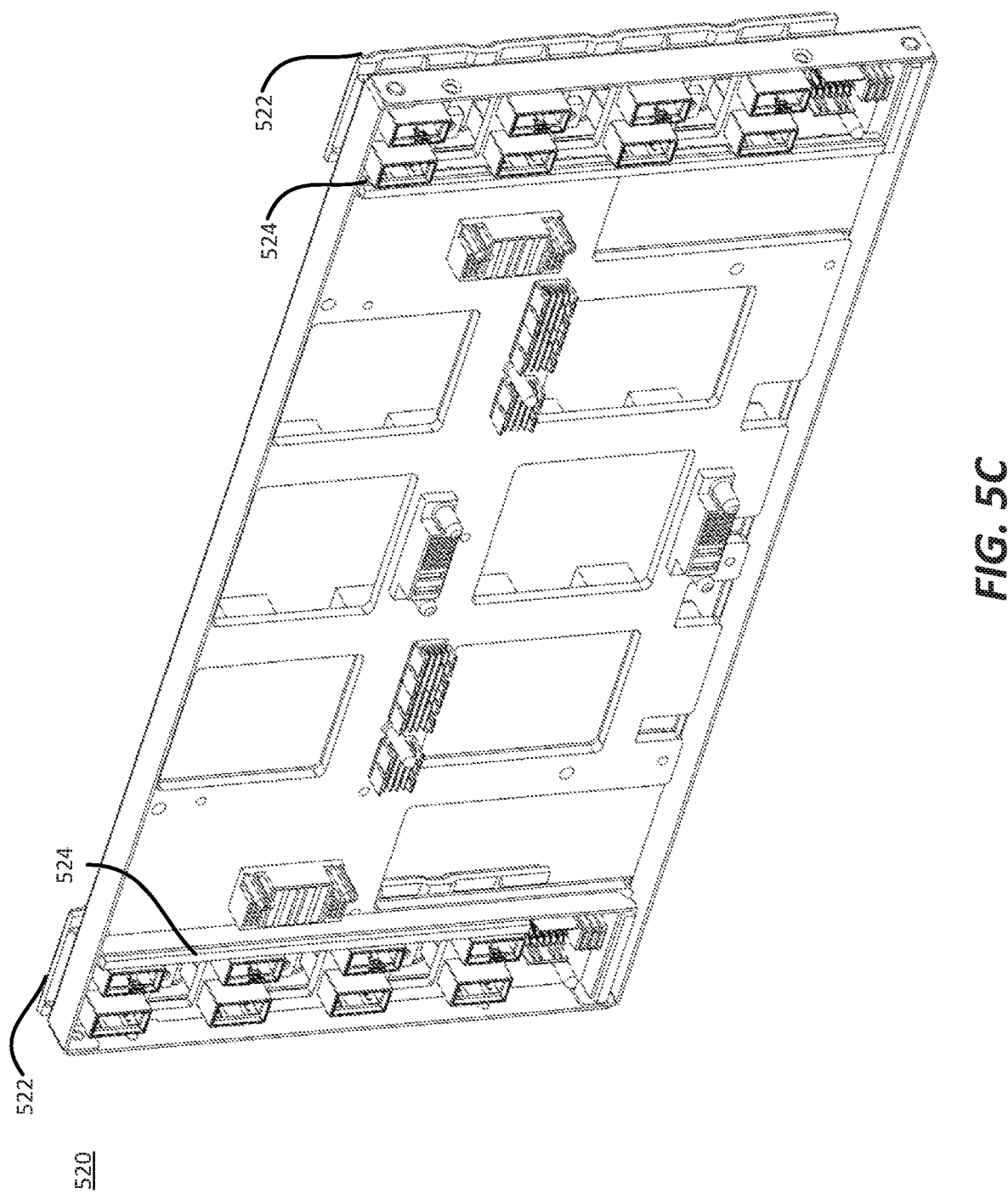
FIG. 5C illustrates a reverse view of the example midplane of FIG. 5B.

FIGS. 5A-5C illustrate example midplanes. Midplane 500 includes unbaffled frame shuffle apertures and no resource management device aperture. Midplane 520 includes frame shuffle airflow baffles and no resource management device aperture. Midplane 906 of FIG. 9B illustrates a midplane 906 with frame shuffle baffles and resource management device apertures 908.

FIG. 5A illustrates the front surface of a midplane. Midplane 500 includes resource device apertures 502, resource device optical connector passthroughs 504, frame shuffle apertures 506, power supply apertures 508, and resource management apertures 510. Resource devices couple to optical connector passthroughs 504, which allow the resource devices to communicatively couple to frame shuffles that are coupled to midplane 500 on its front surface. Frame shuffles direct hot exhaust air through frame shuffle apertures 506 into the resource devices. Resource devices may congregate their temperature sensitive components near the center of midplane 500, allowing hot exhaust air from the frame shuffles to bypass the temperature sensitive components by flowing along the outside edges of the resource devices. The resource devices also receive fresh air from resource device fans through resource device apertures 502. In some examples, each resource device aperture 502 is associated with a corresponding resource device fan.

Power supplies in the front portion of the frame also direct their hot exhaust air rearward. Portions of the power supplies, coupled to airflow baffles, pass through power supply apertures 508 and direct the exhaust air away from the resource devices. In some examples, the airflow baffles may be components of midplane 500. In some other examples, the airflow baffles may be components of the power supplies, which pass through the power supply apertures 508. Power lines from a power routing device and a frame management device may also pass through power supply apertures 508. In some other examples, power lines couple to connectors on the midplane that are coupled to the power supplies. In yet other examples, power lines couples to the power supplies at point on the power supplies in the rear portion of the frame.

In some examples, resource management devices are cooled by airflow through resource device apertures 502. In some other examples, resource management baffles direct airflow from the resource device fans through resource management apertures 510 in midplane 500 to cool the resource management devices.

FIG. 5B illustrates an example midplane including frame shuffle baffles. Midplane 520 includes rear facing frame shuffle baffles 522 on the rear surface of midplane 520. Frame shuffle baffles 522 interface with resource devices received in the frame, and direct hot exhaust air from the frame shuffles into airflow channels within the resource devices. The resource devices may each contain two airflow channels. Rear facing frame shuffle baffles 522 work in concert with the frame shuffle apertures and the front facing frame shuffle baffles to direct exhaust air exiting the frame shuffle through vents interposed between the optical connectors through the frame shuffle apertures and into the airflow channels within the resource devices.

FIG. 5C illustrates a front view of the example midplane of FIG. 5B. Midplane 520 includes the rear facing frame shuffle baffles 522 on the rear surface of midplane 520 and front facing frame shuffle baffles 524 on the front surface of midplane 520. The front facing frame shuffle baffles 524 substantially prevent hot exhaust air from the frame shuffles from being partially or fully directed away from the frame shuffle apertures. As substantially all of the exhaust air from the frame shuffles is directed through the frame shuffle apertures, the rear facing frame shuffle baffles 522 substantially prevent the exhaust air from being partially or fully directed away from the airflow channels of the resource devices. Without frame shuffle baffles 522 and 524, portions of hot exhaust air from the frame shuffles may be directed over temperature sensitive components of the resource devices.

Figure 6:
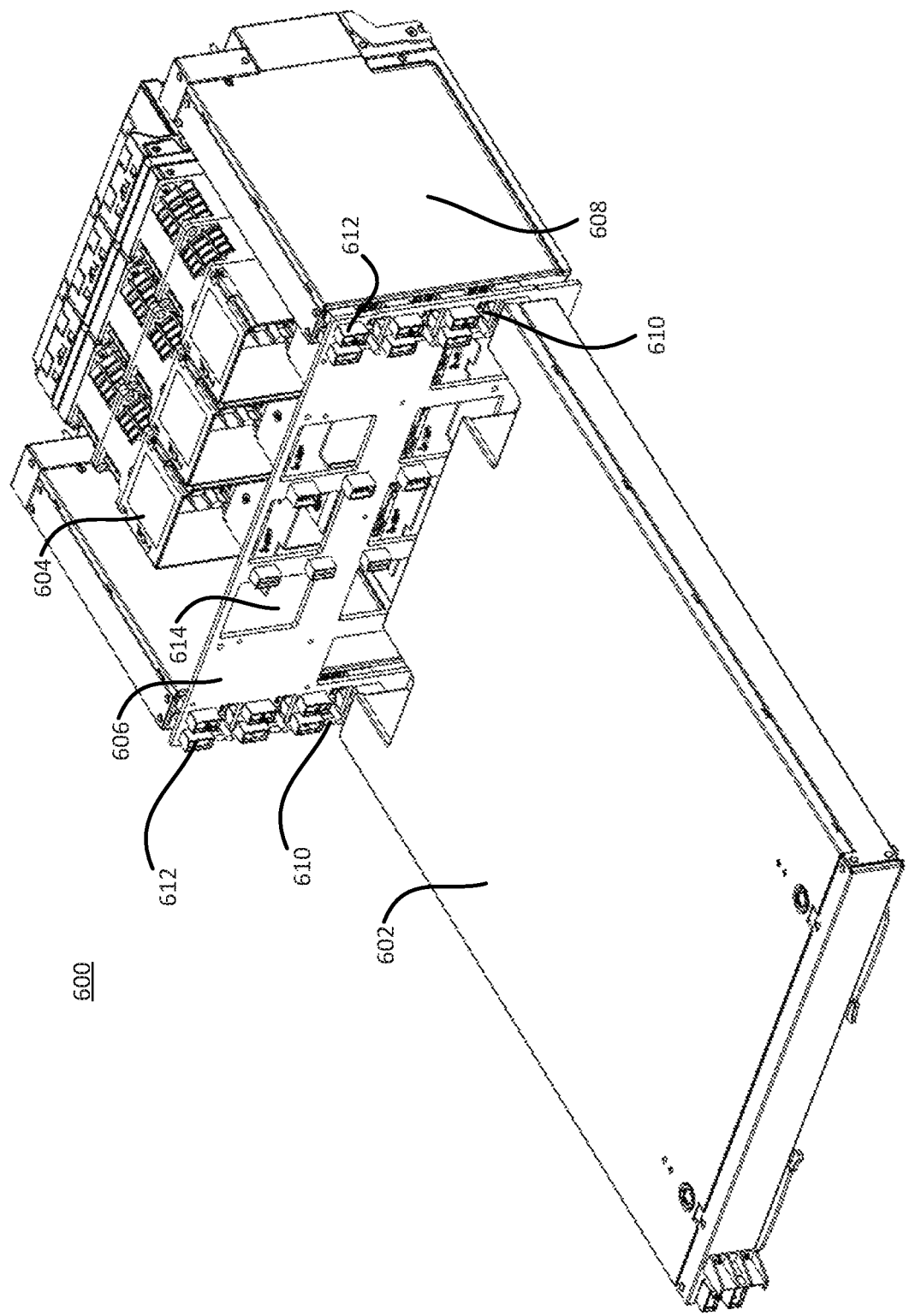
FIG. 6 illustrates an example frame including an example resource module.

FIG. 6 illustrates an example frame including an example resource device. Frame 600 includes resource device 602, resource device fans 605, midplane 606, and frame shuffles 608. Midplane 606 includes frame shuffle apertures 610, optical connector passthroughs 612, and resource device apertures 614.

Resource device 602 is coupled to midplane 606 through optical connector passthrough 612. Resource device 602 couples to optical connector passthroughs 612 on the left edge of midplane 606 (as viewed from the rear of frame 600) and to corresponding optical connector passthroughs 612 on the right edge of midplane 606. Resource device 602 is communicatively coupled with frame shuffles 608 through optical connector passthroughs 612 of midplane 606. Through frame shuffles 608, resource device 602 is connected to a management network that interconnects resource device 602 with other resource devices of frame 600 and other resource devices of other frames. In some examples, multiple frames of a modular computing system are considered one logical frame from the perspective of the management network.

In some examples, resource device 602 is coupled to multiple frame shuffles 608 for redundancy, diversified paths, or higher bandwidth connectivity. In some other examples, resource device 602 is a resource device tray and contains two half-width resource devices, each of which is coupled to a respective frame shuffle 608. In certain examples, midplane 606 includes frame shuffle baffles to direct hot exhaust air from frame shuffles 608 into channels within resource device 602. The channels within resource device 602 direct the hot exhaust air out the back of frame 600 while directing the exhaust air away from temperature sensitive components of resource device 602.

Resource device 602 contains an intake grate positioned near resource device apertures 614. Resource device fans 604 provide airflow through resource device apertures 614 into resource device 602 via the intake grate. Fresh air from resource device fans 604 flows over the temperature sensitive components of resource device 602 and exit through vents in the rear of frame 600 (not shown).

Figure 7:
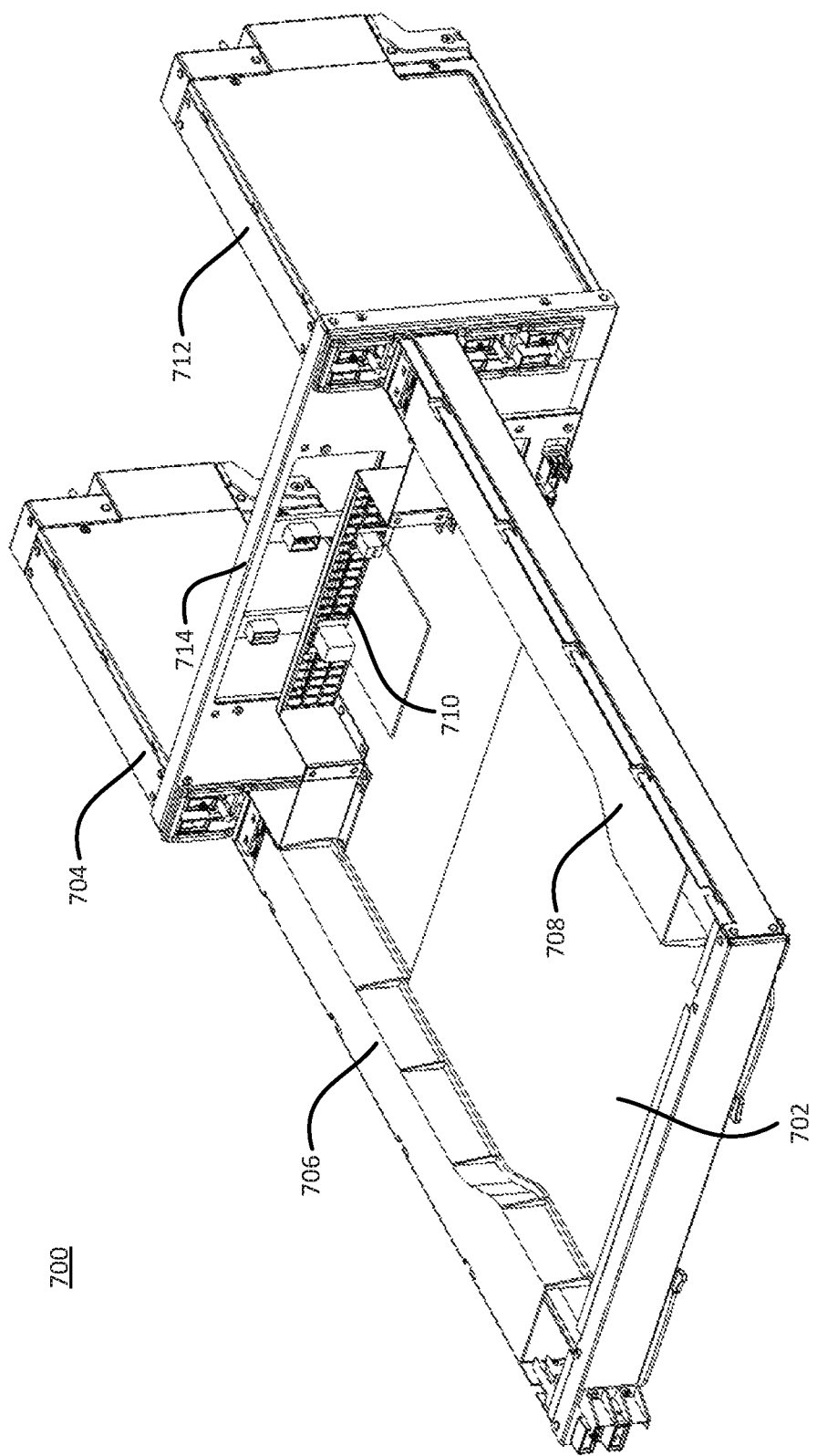
FIG. 7 illustrates an example resource module coupled to example frame shuffles.

FIG. 7 illustrates an example frame including a resource device. Frame 700 includes a resource device 702, frame shuffles 704 and 712, and midplane 714. Resource device 702 includes airflow channel 706, airflow channel 708, and intake grate 710. Frame shuffles 704 and 712 generate heat during operation. Routing devices in each of the frame shuffles may be integrated circuits or systems on a chip that generate heat. Frame shuffle fans provide fresh air to frame shuffles 704 and 712, and direct hot exhaust air through vents interposed between the optical connections and through frame shuffle apertures of midplane 714.

Midplane 714 includes frame shuffle baffles that direct the exhaust air from frame shuffles 704 and 712 to airflow tunnels 706 and 708, respectively. Exhaust air from frame shuffle 704 travels through the frame shuffle aperture of midplane 714 and the frame shuffle baffle directs the exhaust air to travel through airflow tunnel 706. Airflow tunnel 706 directs the exhaust air to the back of frame 700, avoiding contact with temperature sensitive components of resource device 702, which may be located near the center of resource device 702. The exhaust air exits resource device 702 from a rear vent at the rear of frame 700.

Similarly, exhaust air from frame shuffle 712 travels through the frame shuffle aperture of midplane 714 and the frame shuffle baffle directs the exhaust air to travel through airflow tunnel 708. Airflow tunnel 708 directs the exhaust air to the back of frame 700, avoiding contact with temperature sensitive components of resource device 702, which may be located near the center of resource device 702. The exhaust air exits resource device 702 from a rear vent at the rear of frame 700.

Fresh air from resource device fans enters resource device 702 through intake grate 710. The fresh air flows over the temperature sensitive components of resource device 702 and exhaust air is directed out a rear vent of resource device 702. In some examples, intake grate 710 is aligned with multiple resource device apertures of midplane 714.

Figure 8:
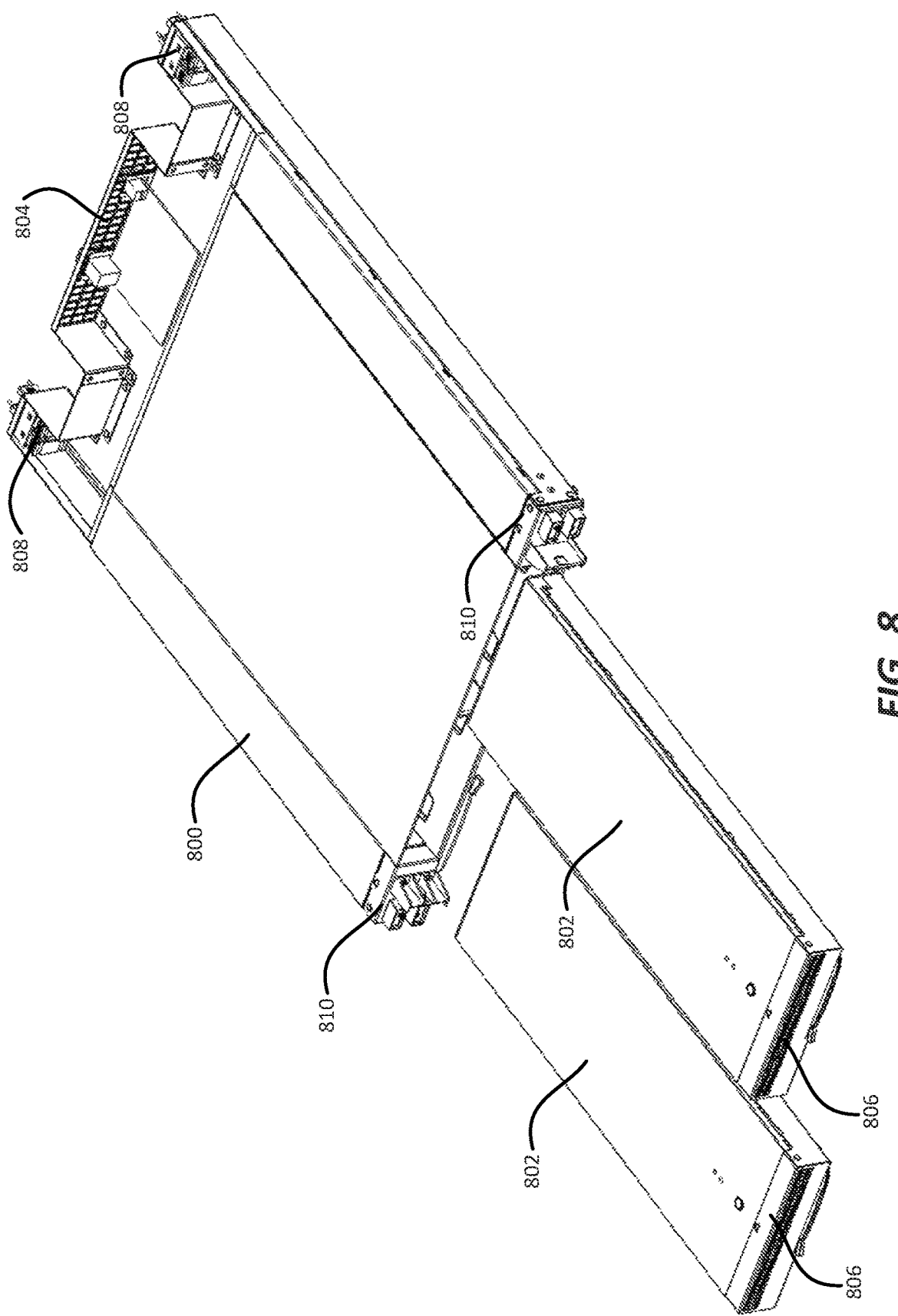
FIG. 8 illustrates an example resource tray with example resource modules.

FIG. 8 illustrates an example resource device tray including half-width resource devices. Resource device tray 800 includes half-wide resource devices 802, intake grate 804, management optical connectors 808, and data optical connectors 810. Half-wide resource devices 802 include rear vents 806.

Resource device tray 800 is received in a frame similarly to how a full-width resource device is received in a frame. In some examples, resource device tray 800 uses the same enclosure as a full-width resource device, but certain internal components are altered to enable receiving half-width resource devices 802. Upon being received in resource device tray 800, Half-width resource devices 802 are communicatively coupled to management optical connectors 808 and data optical connectors 810. In some examples, resource device tray 800 has a data optical connector 810 on one side. In some other examples, resource device tray 800 has data optical connectors 810 on both sides. In some examples, one management optical connector 808 is communicatively coupled to one half-wide resource device 802 and another management optical connector 808 is communicatively coupled to another half-wide resource device 802. When resource device tray 800 is received in a frame, half-wide resource devices 802 are communicatively coupled to frame shuffles through the management optical connectors 808 and a midplane. The half-wide resource devices 802 are also communicatively coupled to other resource devices through the data optical connectors 810 and a rocker-arm plenum.

Fresh air is received from resource device fans and through the midplane. The fresh air enters resource device tray 800 through intake grate 804. The fresh air then flows through resource devices 802, cooling them. Hot exhaust air is directed through rear vents 806 of resource devices 802. Exhaust air from the frame shuffles enters the resource device tray through intake grates near management optical connectors 808. In some examples, the exhaust air from the frame shuffles flows through resource device tray 800 unimpeded, but due to the intake grate positions, stays near the edges of resource device tray 800, avoiding temperature sensitive components of resource devices 802. In some other examples, resource device tray 800 includes airflow tunnels that direct the exhaust air from the frame shuffles to the rear of the frame without coming in contact with temperature sensitive components of resource devices 802.

Figure 9A:
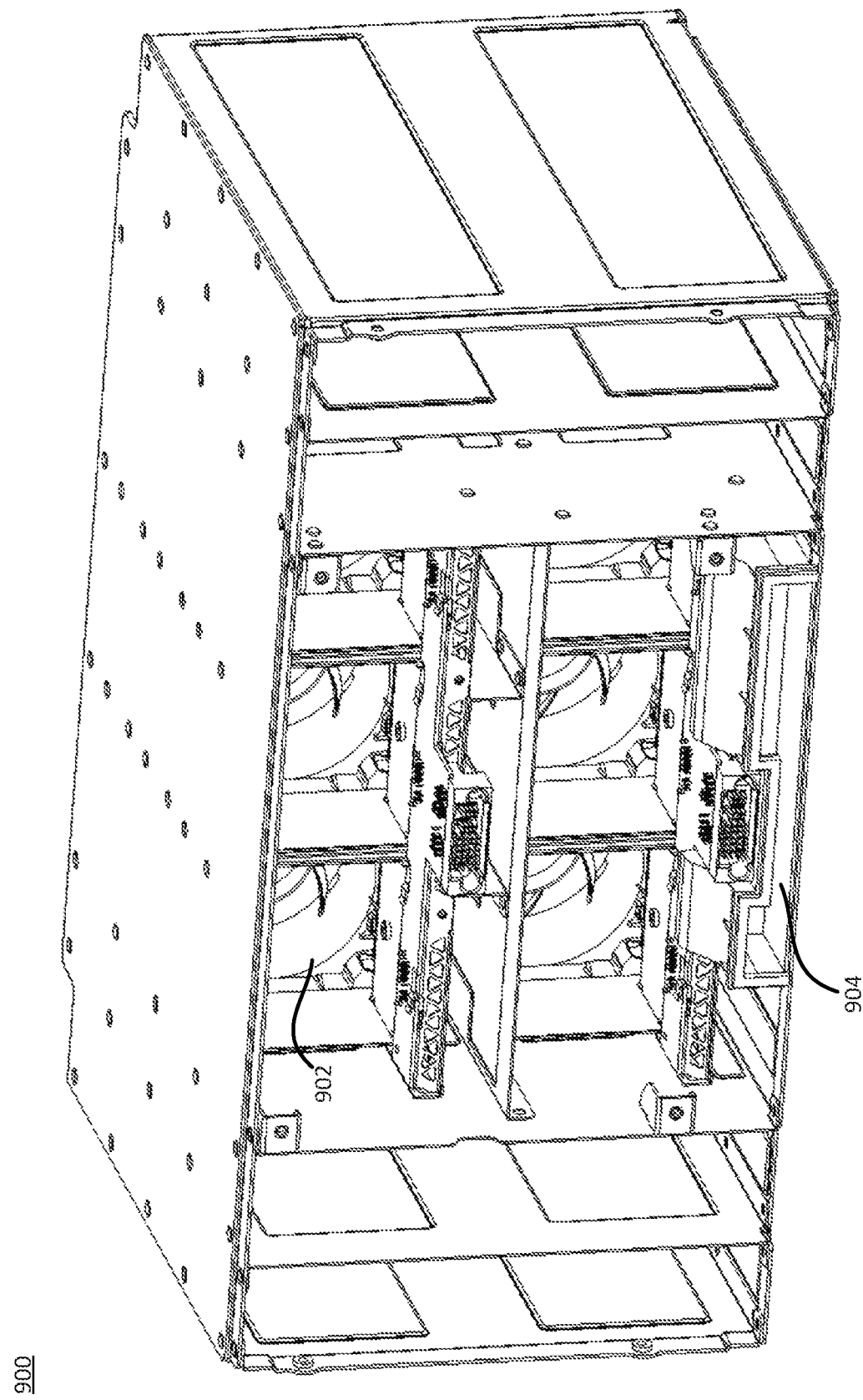
FIG. 9A illustrates an example front half of a frame, including resource management device baffles.
Figure 9B:
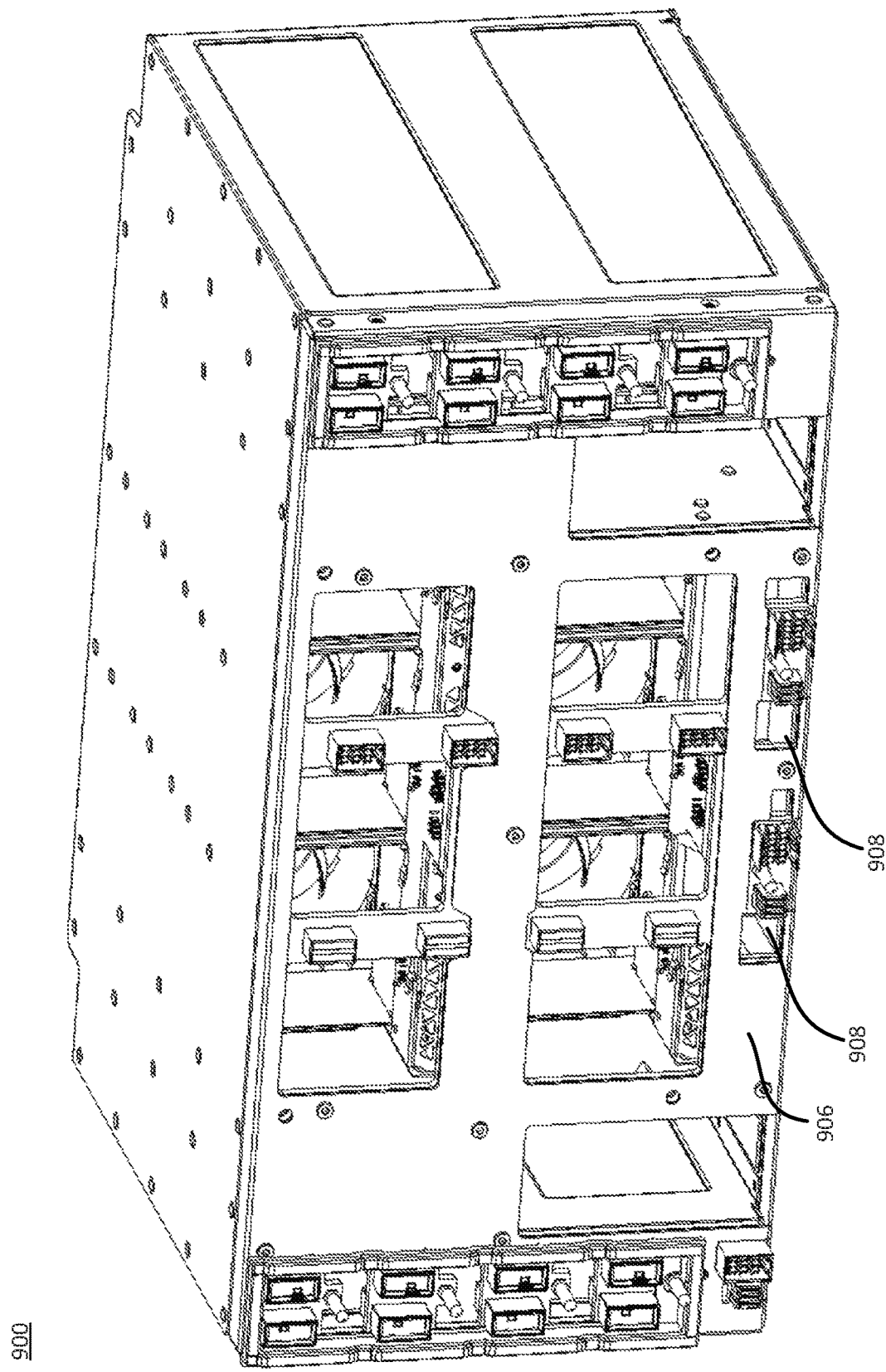
FIG. 9B illustrates the example front half of a frame with an example midplane.
Figure 9C:
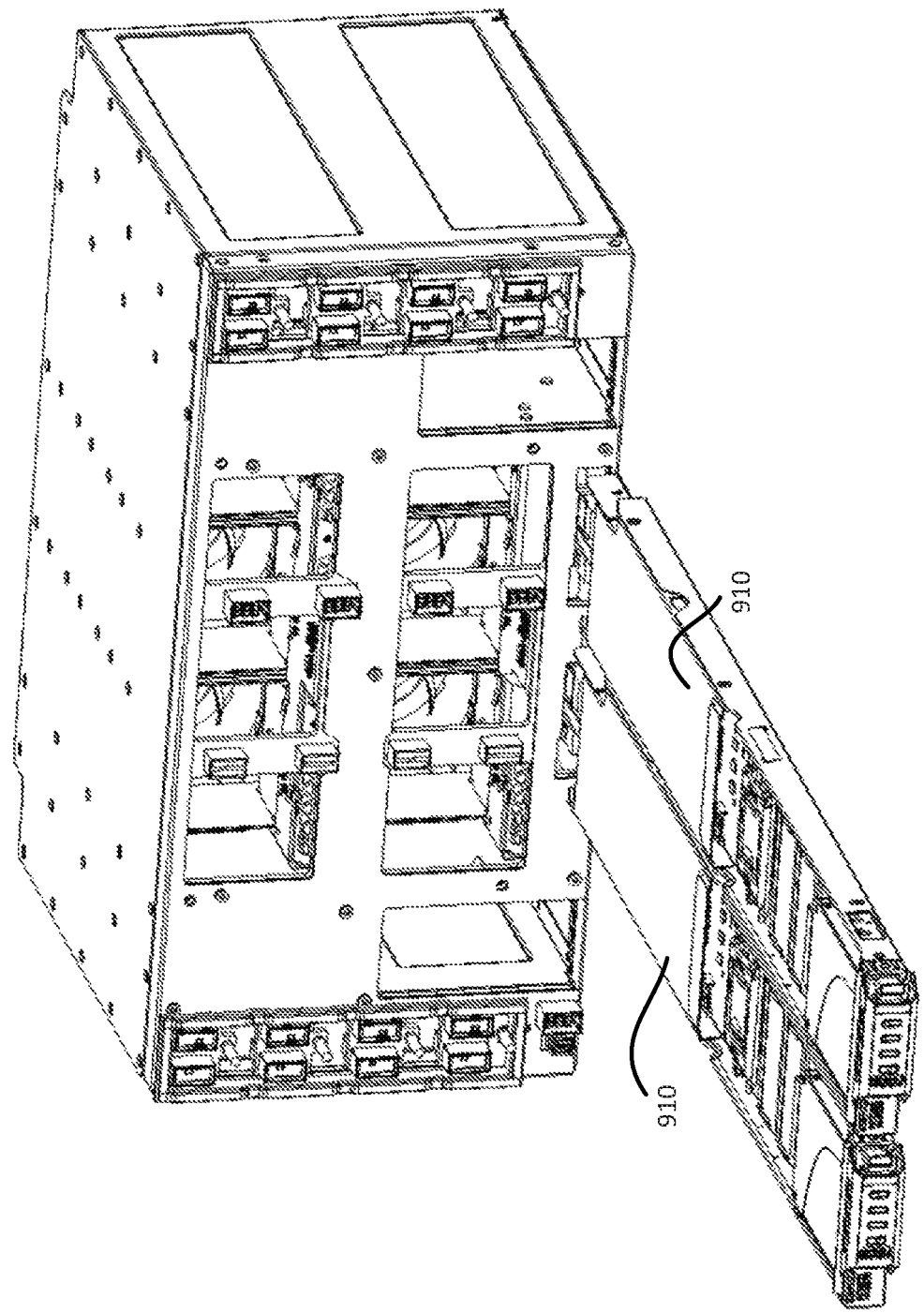
FIG. 9C illustrates the example front half of a frame with example resource management devices.

FIGS. 9A-C illustrate an example frame with a resource management device airflow apparatus. In some examples, a modular computing system does not have a resource management device airflow apparatus, but instead relies on airflow from resource device fans and through resource device apertures of a midplane to cool the resource management devices. In some other examples, the enclosure of the frame may include a resource management device baffle interfaced with resource management device apertures of the midplane to provide additional cooling to the resource management devices.

FIG. 9A illustrates a front portion of a frame with a resource management device baffle. Frame 800 includes resource device fans 902 and a resource management device baffle 904. Resource device fans 902 provide fresh air to resource devices through resource device apertures of a midplane. The lower resource device fans 902 also provide fresh air to resource management device baffle 904. Resource management device baffle 904 directs the fresh air through resource management device apertures of the midplane to provide fresh air to the resource management devices in the rear portion of frame 900. In some examples, resource management device baffle 904 is retained in the enclosure of frame 900. In some other examples, resource management device baffle 904 is retained on the midplane of frame 900. In certain examples, resource management device baffle 904 is wholly retained in the front portion of frame 900. In certain other examples, portions of resource management device baffle 904 are retained in the rear portion of frame 900. In some examples, one of the resource device fans 902 is a resource management device fan, and all fresh air from the resource management device fan is directed by resource management device baffle 904 to cool resource management devices.

FIG. 9B illustrates the frame of FIG. 9A with a midplane. Frame 900 includes midplane 906 retained between the front portion of frame 900 and the rear portion of frame 900. Midplane 906 includes resource management device apertures 908. Resource management device apertures are interposed around management connectors to couple resource management devices to midplane 906.

Resource management device apertures 908 interface with resource management device baffle 904 so that fresh air directed through resource management device baffle 904 passes through resource management device apertures 908. Resource management device apertures 908 are aligned with resource management device baffle 904. Fresh air that is directed through resource management device apertures 908 flow through resource management devices in the rear portion of frame 900.

FIG. 9C illustrates the frame of FIGS. 9A-B with resource management devices. Frame 900 includes resource management devices 910. Resource management devices 910 allocate resources in resource modules to workload tasks. In some examples, resources are allocated to virtual servers (e.g. virtual machines). In some other examples, resources are allocated to tasks in a "bare metal" environment (e.g. with no virtualization).

Resource management devices 910 receive fresh air from resource device fans 902 through resource management device baffle 904 and resource management device apertures 908 of midplane 906. Fresh air then flows through resource management devices 910, cooling heat generating components within. Exhaust air is directed to the rear of frame 900 and out rear vents of resource management devices 910.

Although the present disclosure has been described in detail, it should be understood that various changes, substitutions and alterations can be made without departing from the spirit and scope of the disclosure. Any use of the words "may" or "can" in respect to features of the disclosure indicates that certain examples include the feature and certain other examples do not include the feature, as is appropriate given the context. Any use of the words "or" and "and" in respect to features of the disclosure indicates that examples can contain any combination of the listed features, as is appropriate given the context.

Phrases and parentheticals beginning with "e.g." are used to provide examples merely for the purpose of clarity. It is not intended that the disclosure be limited by the examples provided in these phrases and parentheticals. The scope and understanding of this disclosure may include certain examples that are not disclosed in such phrases and parentheticals.

The invention claimed is:

1. A modular computing system, including:
   a frame, comprising:
      a midplane;
      a first power supply including an airflow baffle to redirect exhaust air, wherein the first power supply is coupled to a first side of the midplane;
      a power routing device comprising:
         a power line electrically coupled to the midplane to provide power to the power supply,
         an airflow channel to receive exhaust air from the first power supply,
         a power connector, electrically coupled to the power line, to connect to an external power cable, and
         wherein the power routing device is coupled to a second side of he midplane; and
      a frame shuffle communicatively coupled to the midplane, comprising:
         a first plurality of optical connectors, each communicatively coupled to one of a plurality of resource devices via the midplane;
         a second plurality of optical connectors, each to communicatively couple with a frame shuffle of an adjacent frame;
         a routing device to:
            switch network traffic between the plurality of resource devices of the frame; and
            direct network traffic to and from the plurality of resource devices of the frame and another plurality of resource devices of the adjacent frame; and
         a frame shuffle fan to provide fresh air through the frame shuffle and direct exhaust air through the midplane.

2. The modular computing system of claim 1, wherein the frame further comprises a frame management device including a management connector communicatively coupled to the midplane and an airflow channel to receive exhaust air from a second power supply including an airflow baffle.

3. The modular computing system of claim 1, wherein the frame further comprises a resource device fan to provide airflow to the plurality of resource devices.

4. The modular computing system of claim 3, wherein at least one resource device is retained in a resource device tray that communicatively couples the at least one resource device to the midplane and permits airflow from the resource device fan to reach the at least one resource device.

5. The modular computing system of claim 3, wherein the airflow baffles of the first and second power supplies direct exhaust air from the respective power supplies away from the plurality of resource devices.

6. The modular computing system of claim 1, wherein the frame shuffle further comprises an airflow baffle to direct exhaust air from the frame shuffle away from the plurality of resource devices.

7. The modular computing system of claim 1, further comprising a rocker-arm plenum communicatively coupled to the plurality of resource devices.

8. A frame, comprising:
a midplane;
a resource device fan, retained on a first side of the midplane, to provide fresh air to a plurality of resource devices through the midplane;
a first power supply, connected to the first side of the midplane, including an airflow baffle to redirect exhaust air;
a second power supply, connected to the first side of the midplane, including an airflow baffle to redirect exhaust air;
a power routing device, on a second side of the midplane, including:
a power line electrically coupled to the power supply through an aperture in the midplane and to provide power to the power supply, an airflow channel to receive exhaust air from the first power supply, and a power connector, electrically coupled to the power line, to connect to an external power cable;
a frame management device, retained in a horizontal position and connected to the second side of the midplane, including an airflow channel to receive exhaust air from the second power supply; and
a frame shuffle, retained in a vertical position within the frame and connected to the first side of the midplane, comprising:
a routing device to:
switch network traffic between the plurality of resource devices of the frame; and
direct network traffic to and from the plurality of resource devices of the frame and another plurality of resource devices of an adjacent frame; and
a frame shuffle fan to provide fresh air through the frame shuffle and direct exhaust air through the midplane.

9. The frame of claim 8, wherein at least one resource device is retained in a resource device tray that permits airflow from the resource device fan to reach the at least one resource device.

10. The frame of claim 8, wherein the midplane includes a plurality of apertures to permit airflow through the midplane.

11. The frame of claim 10, wherein the airflow baffles of the first and second power supplies direct exhaust air from the respective power supplies away from the plurality of resource devices.

12. The frame of claim 8, wherein the midplane comprises an airflow baffle to direct exhaust air from the frame shuffle away from the plurality of resource devices.

13. The frame of claim 8, wherein the frame shuffle is communicatively coupled to the plurality of resource devices via the midplane.

* * * * *